United States Patent [19]

Vertegaal et al.

[11] 4,137,142

[45] Jan. 30, 1979

[54] METHOD AND APPARATUS FOR SPUTTERING PHOTOCONDUCTIVE COATING ON ENDLESS FLEXIBLE BELTS OR CYLINDERS

[75] Inventors: Jacobus-Gerardus Vertegaal, Boxmeer; Lodewijk Anselrode, St. Anthonis, both of Netherlands

[73] Assignee: Stork Brabant B.V., Boxmeer, Netherlands

[21] Appl. No.: 864,330

[22] Filed: Dec. 27, 1977

[51] Int. Cl.$^2$ .............................................. C23C 15/00
[52] U.S. Cl. .................................. 204/192 P; 204/298
[58] Field of Search ........... 204/192 R, 192 C, 192 P, 204/298; 118/33

[56] References Cited

U.S. PATENT DOCUMENTS

| | | | |
|---|---|---|---|
| 564,353 | 7/1896 | Wagg | 118/33 X |
| 2,734,478 | 2/1956 | Reynolds et al. | 118/8 |
| 3,196,784 | 7/1965 | Kraft | 101/123 |
| 3,594,301 | 7/1971 | Bruch | 204/298 |
| 3,718,117 | 2/1973 | Lewicki, Jr. | 118/414 |
| 3,829,373 | 8/1974 | Kuehnle | 204/298 |
| 3,989,569 | 11/1976 | Newman | 156/234 |
| 4,046,712 | 9/1977 | Cairns et al. | 252/447 |

Primary Examiner—John H. Mack
Assistant Examiner—Aaron Weisstuch
Attorney, Agent, or Firm—Silverman, Cass & Singer, Ltd.

[57] ABSTRACT

Apparatus for sputtering a photoconductive coating onto endless flexible belts or cylinders is provided in which the belt or cylinder is shaped in the form of an elongate oval within the sputtering machine and is adapted to be passed over supports whose diameter is substantially less than the diameter of the cylinder if it is a cylinder or of the cylinder which is capable of being formed out of the belt. One support may be a drum and the other support is a structure which may be another drum, preferably idling. In this way it is feasible to have a sputtering machine that is much more narrow than one which would have to sputter a cylinder or belt on a single drum if the supports are mounted vertically.

The second support structure, whether drum or otherwise is adjustably mounted so that its distance from the first support is capable of being varied to enable cylinders or belts of different size to be sputtered. It is also biased to move away from the first support to maintain tension in the substrate member being sputtered.

14 Claims, 2 Drawing Figures

METHOD AND APPARATUS FOR SPUTTERING PHOTOCONDUCTIVE COATING ON ENDLESS FLEXIBLE BELTS OR CYLINDERS

FIELD AND BACKGROUND OF THE INVENTION

The general field of the invention comprises sputtering apparatus and more particularly the invention is concerned with apparatus for sputtering a photoconductive or similar coating onto a seamless belt or cylinder whereby to achieve a continuous substrate member of plastic or metal having such a photoconductive coating on its surface.

In recent times a technique has developed for the sputtering of electrophotographic film which is a meter or more in width and several hundred meters long through the use of sputtering methods and apparatus disclosed in U.S. Pat. Nos. 3,829,373; 3,884,787; 3,905,887; 4,013,539 and 4,026,787

The sputtering which is effected by this apparatus comprises the deposit of material by establishing an electrical plasma condition in a pressure vessel between a target or cathode of the material which is to be deposited and an anode upon which the material is to be deposited. A high energy r.f. source of power is coupled to the target and anode and an inert gas such as argon is introduced into a low pressure chamber provided in the pressure vessel which houses the target and anode. The argon is ionized and heavy ions bombard the target thereby causing molecules of the target material to be driven out of the target. At least an electric field between the target and the anode causes the particles or molecules to be driven to the anode and deposited there. A substrate member of some material, usually an insulating polyester or other polymer sheeting, as disclosed in the above described patents, overlies the anode whereby the material that is driven from the cathode, i.e., sputtered from the target, will deposit on the substrate member. This deposit can be built up to thicknesses which depend upon the conditions in the chamber, the materials involved, the time of the sputtering and other parameter such as power, temperature, gas pressure, etc.

The particular kind of apparatus which is discussed in the above mentioned patents and the apparatus which is described herein are intended to be used for the deposit of a microcrystalline coating of a photoconductive material such as cadmium sulfide or the like having unusual properties. The material itself and the special conditions of its manufacture are disclosed in U.S. Pat. No. 4,025,339.

This invention is especially concerned with the deposit of this type of microcrystalline photoconductive material upon cylindrical or belt-shaped substrate members for use in different kinds of imaging apparatus, for example, convenience or office copiers, printing plate makers, printing presses and the like. Although adaptable to the deposit of the material upon substrate members of plastic, the invention has especial application to the deposit of the photoconductive material upon substrate members comprising sleeves of flexible metal.

The substrate members which are of importance insofar as the practical application of the invention herein is concerned comprise seamless thin-walled metal cylinders of nickel, copper or other metal which are formed by electrodeposition. U.S. Pat. Nos. 2,287,122 and 3,354,519 disclose this type of cylinder and the methods of making the same. The cylinder which is to be coated according to the invention is imperforate rather than foraminous as used heretofore inasmuch as ink or dye is to be transferred through the medium of the photoconductive coating on the exterior of the cylinder rather than by expressing the ink through the wall of the cylinder by doctor means.

The problems of coating a cylinder of this kind include principally maintaining the wall precisely in position while it is passing through the plasma produced by the conditions in the chamber to achieve a precisely uniform coating. Using a drum for mounting the cylinder or mounting a belt within the sputtering apparatus and driving the drum is one solution to the problems which arise. This invention proposes another solution which admirably solves several of the difficulties which attach to the use of a drum of the same diameter as the interior diameter of the cylinder or the belt formed into a cylinder for sputtering.

The invention provides structure to enable the belt or cylinder to be easily mounted on the anode; structure which maintains the belt or cylinder under tension at all times; structure which enables a single sputtering apparatus to accommodate cylinders or belts of a variety of different diameters; and a type of sputtering apparatus which occupies less floor space than one which utilizes a single drum for mounting the cylinder or belt.

For the purpose of this specification and claims, the word "sleeve" will be used as generic to both a cylinder and a belt.

SUMMARY OF THE INVENTION

Sputtering apparatus for sputtering a coating of a photoconductive material onto a flexible sleeve in which there is a pair of supports in the sputtering chamber over which the sleeve is stretched in an elongate oval form with parallel sides and arcuate ends. Each support has at least one arcuate side facing away from the other support upon which the arcuate ends of the oval are adapted to engage during the sputtering process.

The sleeve is driven to pass over the supports repeatedly in the sputtering atmosphere created within the apparatus by suitable drive means which may include one of the supports as a rotating cylinder.

The supports are adjustable toward and away from one another in order to accommodate ovals of different length and are arranged to apply a mechanical bias to the sleeve during sputtering in order that it tightly engage against the arcuate side of the support where the sputtering takes place. The apparatus is preferably arranged with the supports aligned vertically so that the apparatus occupies less floor space than it would if the sputtering were effected by engaging the cylinder or belt formed into a cylinder on a single rotary drum.

DESCRIPTION OF THE PREFERRED EMBODIMENTS

The sputtering apparatus of the invention is especially intended for use in sputtering a coating of the type disclosed in said U.S. Pat. No. 4,025,339 but is not necessarily limited thereto. The description herein will be specifically directed to the requirements for such sputtering as exemplary.

Figure 1:
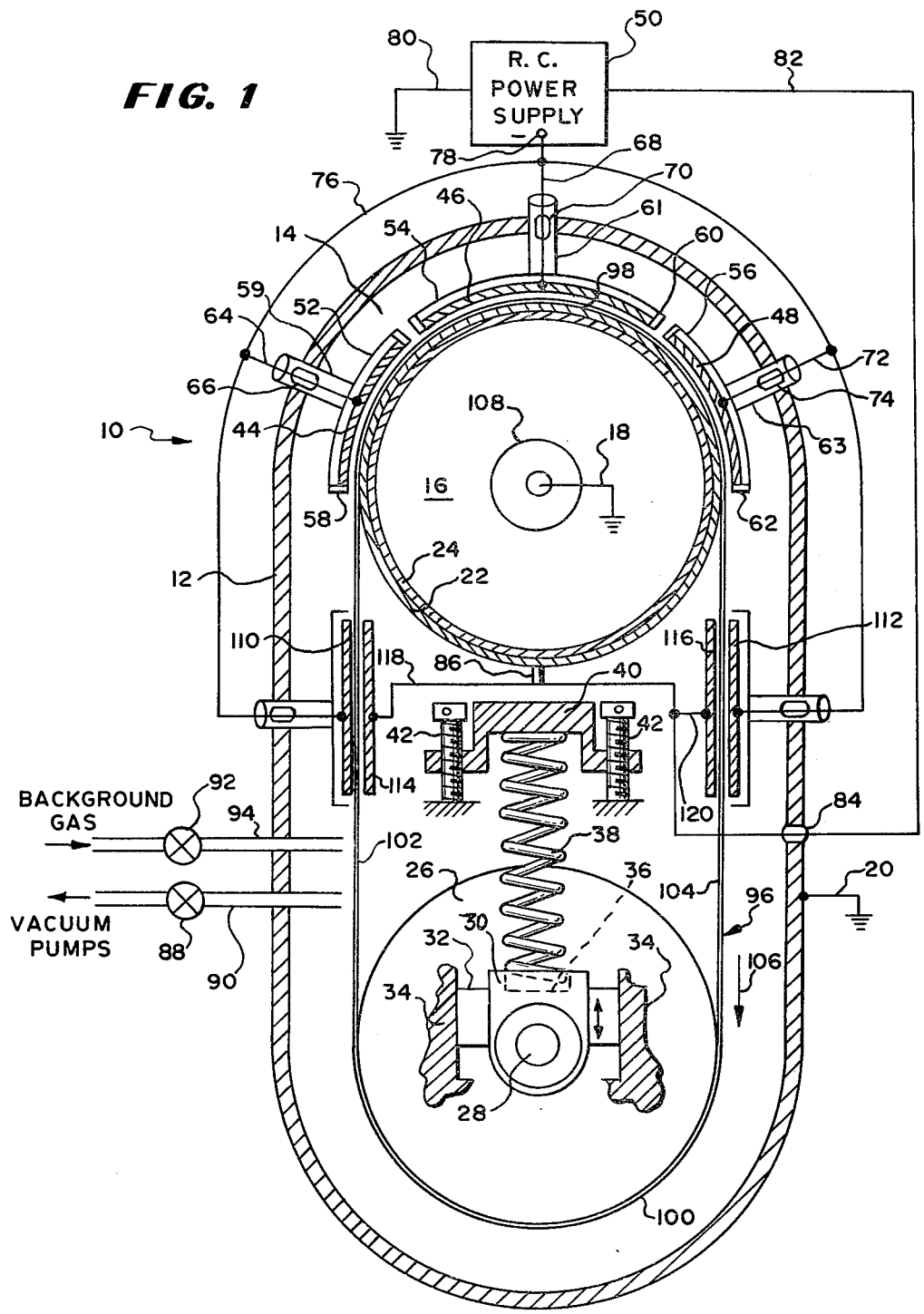
FIG. 1 is a diagrammatic sectional view through sputtering apparatus constructed in accordance with the invention and FIG. 2 is a similar diagrammatic view of a modified form of the invention but omitting components of the sputtering apparatus for simplicity.

In FIG. 1 there is illustrated an apparatus 10 which is very diagrammatic. Considerable structure and operating systems are omitted but reference may be had to the patents mentioned above for supplying details which are required. In addition to those patents named, several other U.S. Patents may be referred to for other structure which is advantageous such as means for introducing background gas (U.S. Pat. No. 3,976,555) and means for maintaining the anode at a bias potential (U.S. Pat. No. 4,014,779). No supporting framework or base for the apparatus is shown but is presumed to be provided. Also closures, seals, coolant and heat exchange liquid systems, etc. are not shown.

The apparatus 10 comprises a pressure vessel 12 which in this case is arranged to have a relatively narrow transverse dimension and a relatively high vertical dimension as shown. This is feasible because of the construction to be described which enables the apparatus 10 to occupy less floor space than if it were constructed otherwise. The pressure vessel defines an interior chamber 14 within which the sputtering will take place. Mounted at the top of the chamber 14 is an anode in the form of a drum 16 which in this case may be presumed to be of metal and grounded at 18. For practical purposes the vessel 10 is of metal and grounded as well as indicated at 20.

The anode 16 has an outer metal skin 22 which is insulatedly mounted relative to the body of the drum 16 by means of a coating or layer of insulating material 24 so that the skin is not at ground potential. This will shortly be explained.

At the bottom of the chamber 14 there is mounted a support 26 which in this case is an idler drum mounted on a shaft 28 journalled in a pillow block 30 that in turn is mounted on a slide 32 that is confined for vertical up and down movement by the guides 34. These guides 34 are fixed to a suitable wall or framework (not shown) mounted to the vessel 12. A seat 36 holds the bottom end of a helical spring 38 whose upper end is engaged against a bracket 40 which can be raised or lowered by suitable jack screws 42 to change the tension of the spring 38 and thereby vary the effective distance between the drum 16 and the support 26.

There are three targets shown at 44, 46 and 48 arcuately arranged around the upper side of the drum 16 and spaced therefrom in parallel arrangement. This forms the gap between the targets and the anode in which the electric plasma for sputtering will appear. Each target has its own base, shielding and electrical connection to the r.f. supply 50. Each is mounted to the wall of the vessel 12. The bases are 52, 54 and 56, respectively; the shielding is shown at 58, 60 and 62, respectively and will be considered grounded; the connections are 64 through the insulating lead-in 66, 68 through the insulating lead-in 70, and 72 through the insulating lead-in 74; and the mountings are 59, 61 and 63. The coolant system connected with the bases 52, 54 and 56 is now shown. A harness 76 is illustrated coupled to all of the connections 64, 68 and 72 extending to the high negative potential terminal 78 of the r.f. power supply 50, but it is to be understood that this is only by way of symbol. There will have to be proper matching and tuning of targets to assure maximum transfer of power.

The r.f. power supply 50 is shown grounded at 80 and there is also a low voltage bias line 82 which comes through a suitable insulating lead-in 84 and connects to a wiper 86 that slides on the skin 22. The anode 22 is thus the effective anode and is at a voltage which is somewhat below ground considering the diode action of the sputtering system. This provides the bias discussed in said U.S. Pat. No. 4,025,339.

The chamber 14 is evacuated and maintained at low pressure by means of suitable vacuum pumps connected through the valve 88 in the line 90. Background gas is furnished by way of the valve 92 in the line 94.

In operation, a substrate member 96 which may be either originally a metal or plastic cylinder or a belt is stretched over the drums 16 and 26. This is easily done by adjusting the position of the bracket 40, which, as will be understood, is only an example of a structure for adjusting the distance between the two supports 16 and 26. After engaging the substrate member 96 in place, it is configured in the form of an oval, with arcuate ends 98 and 100 at top and bottom respectively and parallel sides 102 and 104. It is seen that the width of the apparatus 10 would have to be substantially increased if a single drum were used as the mounting for the substrate member 96 and the latter were shaped into cylindrical form to be so mounted.

The bracket 40 is moved away from the drum 16 to a point where the spring 38 is under compression and tending to oppose the compression by elongating, thereby applying tension on the parallel sides 102 and 104 of the substrate member 96. In this condition, the substrate member 96 is moved as for example in the direction of the arrow 106 and this is done by translating the substrate member 96. The shaft 108 of the drum 16 may be rotated in a suitable direction by means (not shown) on the exterior of the chamber 14 coupled to the shaft 108 through the wall of the vessel 12. At the same time the systems are all set in operation to cause the sputtering and the movement is maintained for a time sufficient to build up the desired deposit of photoconductor.

In the case that the substrate member 96 is metal, the sputtering of the photoconductor is done directly. In the case that it is of polyester or other insulating material, it is required that a layer of ohmic material such as indium-tin oxide be deposited onto the surface of the substrate member 96 to enable charging the surface of the photoconductor during use. Thereafter the photoconductor material is sputtered onto the ohmic layer.

The same apparatus or different apparatus may be used for depositing the ohmic layer. Its thickness is usually several hundred Angstroms while the thickness of the photoconductive layer is normally of the order of 2000 Angstroms to about 6000 Angstroms.

If desired, additional targets and anodes may be provided as shown symbolically in the center of FIG. 1. The targets 110 and 112 have construction similar to that of the other targets and are mounted in the same way, connected to the power supply harness 76 in the same way; hence no further description of the same is needed. Each has an anode 114 and 116 whose mountings are not shown but whose connections to the bias potential line 82 are shown at 118 and 120.

Figure 2:
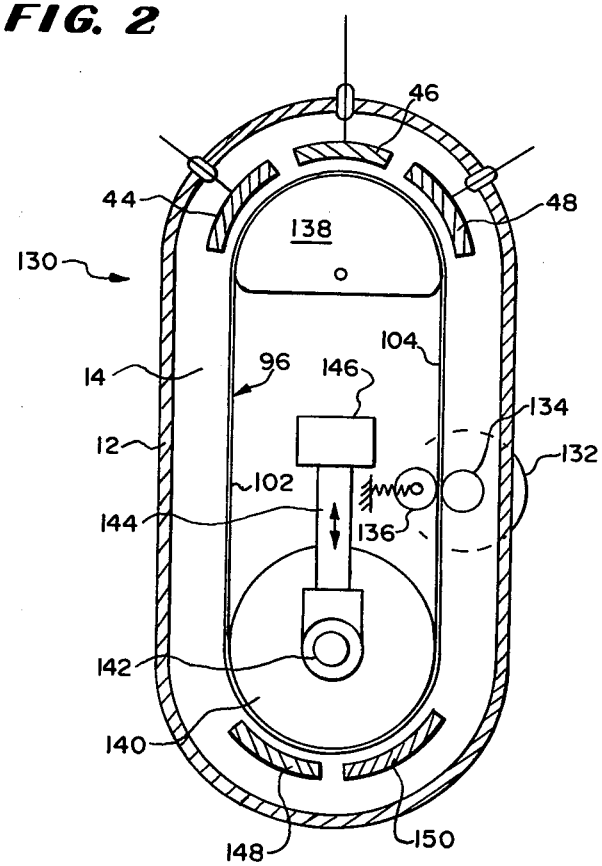

FIG. 2 illustrates a form of the invention at 130 which differs from that of FIG. 1 primarily in that the driving of the substrate 96 is effected by a drive motor 132 and friction roller 134 nipping the side 104 between the roller 134 and a spring-pressed back-up roller 136.

While the photoconductive coating applied has good resistance to abrasion, it would probably be more advantageous to drive the substrate member 96 from the interior thereof where absence of abrasion marks is not as important as on the photoconductive surface itself. Thus, there could be driven roller means on the interior of the oval pressing outwardly and thereby enabled to apply driving friction without the need for back-up rollers on the exterior of the oval.

In FIG. 2, the targets at 44, 46 amd 48 can be quite similar to those of FIG. 1 and with the same connections, mountings, etc. The upper support in this case is in the form of a partial cylinder 138 that is fixed, leaving the substrate member 96 to slide over its surface. The bottom end support 140 is in the form of a drum that is idling, is mounted on a shaft 142 carried at the bottom end of a link or arm 144 that is adjustable in length by some mechanism indicated at 146. This could be for example a hydraulic fluid piston controlled from the exterior of the chamber 14 to enable the shaft 142 to be moved up or down, in one instance to decrease the distance between supports when the substrate member 96 is to be mounted or removed, and in the second instance to apply tension on the sides 102 and 104 during the sputtering operation.

In the case that the substrate member 96 is non-magnetic and the support drum 140 is magnetic material, magnets 148 and 150 can apply a downward force on the roller 140 for tensioning the sides 102 and 104 without the need for a complex mechanism such as 144 and 146. Suitably guided, a heavy roller 140 in certain cases will apply sufficient force by gravity to keep the substrate member 96 in tension and tightly engaged on the support 16 or 138.

Variations are capable of being made without departing from the spirit or scope of the invention as defined in the appended claims.

What is claimed and it is desired to secure by Letters Patent of the United States is:

1. Sputtering apparatus for sputtering a coating of a photoconductive material onto a flexible sleeve substrate member which comprises:
    A. a sputtering vessel having a sputtering chamber and means for establishing an r.f. plasma condition in the chamber including target means of a photoconductive material and anode means arranged opposite the target means and defining at least one gap between them within which the plasma condition appears during the sputtering operation,
    B. means for configuring the sleeve substrate member in an oval configuration having arcuate ends and straight sides, said configuring means including at least two support members having arcuate sides facing away from one another, the sleeve substrate member adapted to be stretched between the support members,
    C. means for applying tension to the straight sides and comprising structure for biasing the support members to move apart, and
    D. means for driving the sleeve substrate member over the support members to pass through said gap.

2. The sputtering apparatus as claimed in claim 1 in which the support members are arranged vertically one above the other.

3. The sputtering apparatus as claimed in claim 1 in which one of said support members comprises the anode.

4. The sputtering apparatus as claimed in claim 1 in which one of said support members is a rotary drum.

5. The sputtering apparatus as claimed in claim 1 in which one of said support members is a rotary drum and comprises the means for driving the substrate member.

6. The sputtering apparatus as claimed in claim 1 in which the biasing structure comprises spring means tending to push the support members apart.

7. The sputtering apparatus as claimed in claim 1 in which the distance between the support members is adjustable for different sizes of substrate members.

8. The sputtering apparatus as claimed in claim 2 in which the means for applying tension comprise the bottom support member being formed as a roller having substantial weight and hanging from the upper support member through the medium of the sleeve during the sputtering operation.

9. The sputtering apparatus as claimed in claim 4 in which the drum includes a shaft and the biasing structure comprises mechanical means for moving the axis of the shaft of the drum relative to the other support member.

10. The sputtering apparatus as claimed in claim 1 in which the biasing structure is magnetic.

11. The sputtering apparatus as claimed in claim 3 in which the target means conform to the arcuate side of the support member comprising the anode.

12. The sputtering apparatus as claimed in claim 1 in which the said gap is located between the support members whereby a straight side will be led through said gap.

13. The sputtering apparatus as claimed in claim 5 in which said rotary drum also comprises the anode.

14. A method of sputtering a photoconductive material onto a flexible sleeve substrate member in a sputtering chamber which has means for establishing a sputtering condition within the chamber which comprises:
    A. providing in the chamber a pair of supports having arcuate ends,
    B. moving the supports towards one another a distance sufficient to enable the substrate member to be looped over the supports,
    C. moving the supports apart after so engaging the substrate member a sufficient amount to form an oval having arcuate ends closely engaging over the arcuate ends of the supports and straight sides between the arcuate ends of the oval,
    D. establishing a sputtering condition including a plasma belt within the chamber,
    E. translating the substrate member in a repetitive cycle through the plasma belt while maintaining tension on the straight sides for a period of time to deposit a coating of photoconductive material,
    F. discontinuing the sputtering condition,
    G. moving the supports toward one anotheer to relieve the tension and loosen the substrate member, and
    H. removing the substrate member from the chamber.

* * * * *